（12）United States Patent
Kim et al.

(10) Patent No.: US 11,436,950 B2
(45) Date of Patent: Sep. 6, 2022

(54) STRETCHABLE DISPLAY DEVICE

(71) Applicant: LG Display Co., Ltd., Seoul (KR)

(72) Inventors: Kihan Kim, Gimpo-si (KR); Hyokang Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 275 days.

(21) Appl. No.: 16/924,012

(22) Filed: Jul. 8, 2020

(65) Prior Publication Data

US 2021/0027673 A1    Jan. 28, 2021

(30) Foreign Application Priority Data

Jul. 23, 2019 (KR) ........................ 10-2019-0089218

(51) Int. Cl.
*G09F 9/30* (2006.01)
*H01L 51/00* (2006.01)
*H01L 27/32* (2006.01)
*H01L 51/52* (2006.01)

(52) U.S. Cl.
CPC .......... *G09F 9/301* (2013.01); *H01L 27/3276* (2013.01); *H01L 51/0097* (2013.01); *H01L 51/5271* (2013.01); *H01L 2251/5338* (2013.01)

(58) Field of Classification Search
CPC ...................................................... G09F 9/301
See application file for complete search history.

(56) References Cited

FOREIGN PATENT DOCUMENTS

KR    20180080091 A    7/2018

*Primary Examiner* — Vip Patel
(74) *Attorney, Agent, or Firm* — Seed IP Law Group LLP

(57) ABSTRACT

A stretchable display device according to embodiments of the present disclosure includes a plurality of first substrates in which a plurality of pixels are defined, the plurality of first substrates being spaced apart from each other; a plurality of second substrates disposed between first substrates adjacent to each other among the plurality of first substrates to connect the adjacent first substrates; a lower substrate on which a plurality of first areas, a plurality of second areas, and a plurality of third areas excluding the plurality of first areas and the plurality of second areas are defined, the plurality of first substrates being disposed in the plurality of first areas, and the plurality of second substrates being disposed in the plurality of second areas; and a plurality of align keys disposed in a portion of the plurality of third areas and formed of an elastic material.

20 Claims, 8 Drawing Sheets

STRETCHABLE DISPLAY DEVICE

CROSS-REFERENCE TO RELATED APPLICATIONS

This application claims the priority benefit of Korean Patent Application No. 10-2019-0089218 filed on Jul. 23, 2019, in the Korean Intellectual Property Office, the disclosure of which is incorporated herein by reference.

BACKGROUND

Technical Field

The present disclosure relates to a stretchable display device.

Description of the Related Art

Display devices used for a computer monitor, a TV, a mobile phone, and the like include an organic light-emitting display (OLED) that emits light by itself, a liquid-crystal display (LCD) that requires a separate light source, and the like.

Such display devices are being applied to more and more various fields including not only a computer monitor and a TV, but personal mobile devices, and thus, display devices having a wide display area and reduced volume and weight are being studied.

Recently, a stretchable display device manufactured to be able to stretch in a specific direction and change into various shapes by forming a display unit, lines, and the like on a flexible substrate such as plastic that is a flexible material has been spotlighted as a next generation display device.

BRIEF SUMMARY

The present disclosure provides a stretchable display device capable of reducing or minimizing stress generated when stretching the stretchable display device by configuring align keys disposed on a lower substrate with a material having elasticity.

The present disclosure further provides a stretchable display device capable of preventing the occurrence of cracks or breakage when stretching the stretchable display device by configuring align keys disposed on a lower substrate with a stretchable material.

The present disclosure also provides a stretchable display device having improved reliability by configuring align keys with a stretchable material.

Benefits of the present disclosure are not limited to the above-mentioned benefits, and other benefits, which are not mentioned above, can be clearly understood by those skilled in the art from the following descriptions.

According to an aspect of the present disclosure, a stretchable display device includes a plurality of first substrates in which a plurality of pixels are defined, the plurality of first substrates being spaced apart from each other; a plurality of second substrates disposed between first substrates adjacent to each other among the plurality of first substrates to connect the adjacent first substrates; a lower substrate on which a plurality of first areas, a plurality of second areas, and a plurality of third areas excluding the plurality of first areas and the plurality of second areas are defined, the plurality of first substrates being disposed in the plurality of first areas, and the plurality of second substrates being disposed in the plurality of second areas; and a plurality of align keys disposed in a portion of the plurality of third areas and formed of an elastic material.

According to another aspect of the present disclosure, a stretchable display device includes an align key area in which a plurality of align keys are disposed; a plurality of line areas in which connection lines are disposed, the plurality of line areas surrounding the align key area; and a flexible substrate in which a plurality of rigid substrates are disposed, the flexible substrate being disposed between the plurality of line areas, wherein the plurality of align keys include an elastic resin and reflective particles dispersed in the elastic resin.

Other detailed matters of the embodiments are included in the detailed description and the drawings.

According to the present disclosure, effects of providing stretchable align keys are provided.

According to the present disclosure, stress generated when stretching the stretchable display device can be reduced or minimized, and the occurrence of cracks or breakage can be prevented.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
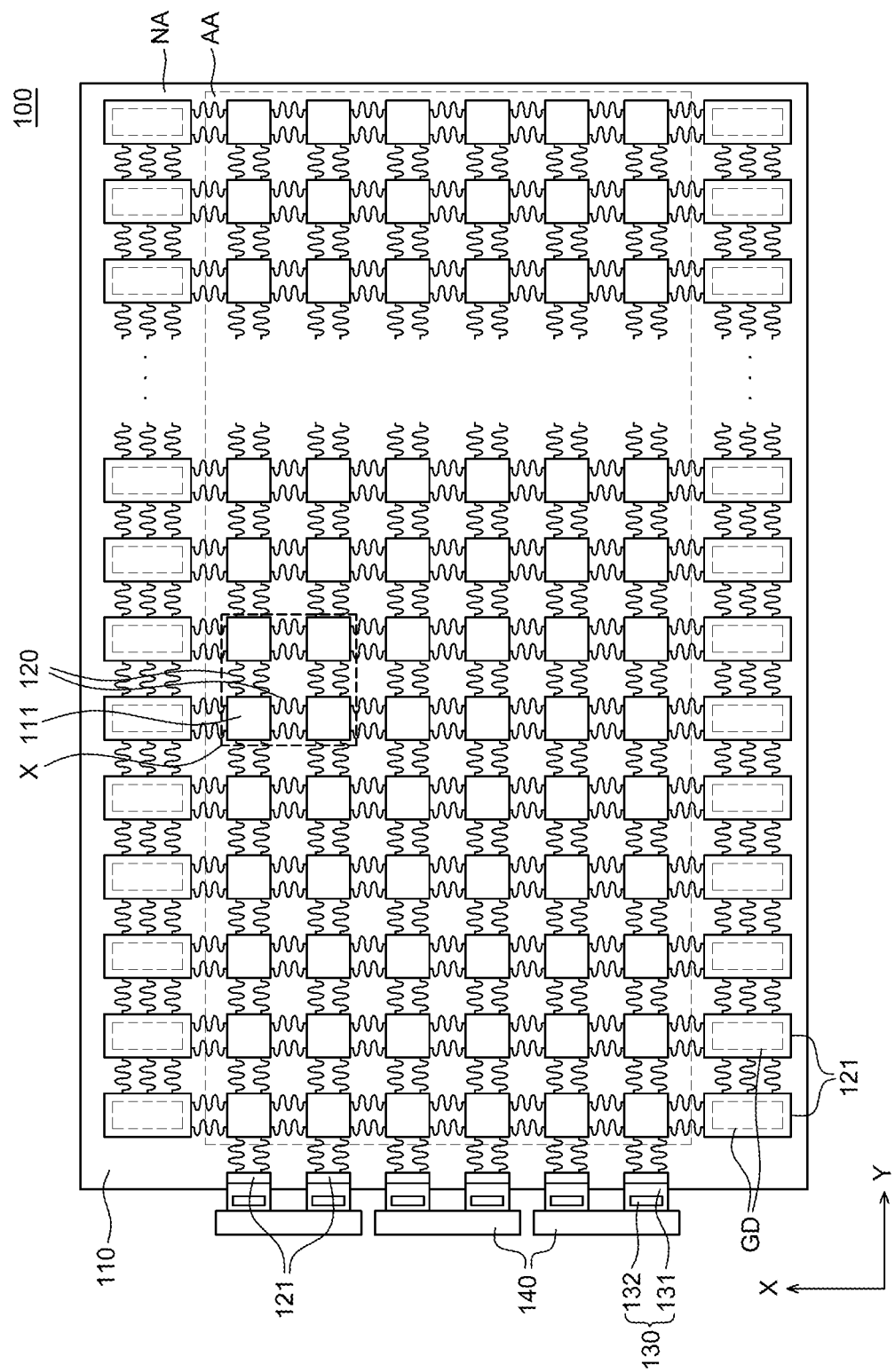
FIG. 1 is a schematic plan view of a stretchable display device according to embodiments of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including" and "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, embodiments of the present disclosure will be described in detail with reference to accompanying drawings.

A stretchable display device may refer to a display device which can display images even it is bent or stretched. The stretchable display device may have higher flexibility than typical display devices. Thus, the stretchable display device can be freely deformed by a user's manipulation such as bending or stretching of the stretchable display device. For example, when the user seizes an end of the stretchable display device and pulls the stretchable display device, the stretchable display device can be stretched by force of the user. If the user places the stretchable display device on an uneven wall surface, the stretchable display device can be bent according to the shape of the wall surface. When the force applied by the user is removed, the stretchable display device can return to its original shape.

FIG. 1 is a schematic plan view of a stretchable display device according to embodiments of the present disclosure. Referring to FIG. 1, a stretchable display device 100 includes a lower substrate 110, a plurality of first substrates 111, a plurality of second substrates 120, a plurality of additional substrates 121, a COF (Chip on Film) 130, and a printed circuit board 140.

The lower substrate 110 serves to protect and support various components of the stretchable display device 100.

The lower substrate 110 is a flexible substrate and may be formed of a bendable, pliable, or stretchable insulating material. For example, the lower substrate upper 10 may be formed of silicone rubber such as polydimethylsiloxane (PDMS) and an elastomer such as polyurethane (PU), and polytetrafluoroethylene (PTFE) or the like. Thus, the lower substrate 110 may have flexibility. However, the materials of the lower substrate 110 are not limited thereto.

The lower substrate 110 is a flexible substrate and may be reversibly expandable and contractible. Further, the lower substrate 110 may have an elastic modulus of several MPa to several hundreds of MPa, for example, about 0.7 MPa to 1 MPa. In addition, the lower substrate 110 may have a breaking elongation of 100% or more. Herein, the breaking elongation refers to a stretch rate at the time when an object being stretched is broken or cracks. A thickness of the lower substrate 110 may be about 10 µm to 1 mm, but is not limited thereto. The term modulus includes elastic modulus but in other embodiments, it may also include volume modulus, bulk modulus, or the like.

The lower substrate 110 may include a display area AA and a non-display area AA adjacent to the display area AA.

The display area AA refers to an area where images are displayed in the stretchable display device 100. In the display area AA, a display element and various drive elements for driving the display element are disposed. The display area AA includes a plurality of pixels including a plurality of sub-pixels. The plurality of pixels are disposed in the display area AA and include a plurality of display elements. Each of the plurality of sub-pixels may be connected to various lines. For example, each of the plurality of sub-pixels may be connected to various lines such as a gate line, a data line, a high potential power line, a low potential power line, a reference voltage line, and the like.

The non-display area AA refers to an area adjacent to the display area AA. The non-display area AA is adjacent to the display area AA. In some embodiments, the non-display area AA surrounds the display area AA. In the non-display area AA, images are not displayed, and lines and circuits may be disposed. For example, a plurality of pads may be disposed in the non-display area AA, and the pads may be connected respectively to the plurality of sub-pixels disposed in the display area AA.

On the lower substrate 110, the plurality of first substrates 111 and the plurality of additional substrates 121 are disposed. The plurality of first substrates 111 may be disposed in the display area AA of the lower substrate 110, and the plurality of additional substrates 121 may be disposed in the non-display area AA of the lower substrate 110. FIG. 1 illustrates that the plurality of additional substrates 121 in the non-display area AA are disposed on upper and lower sides and left side of the display area AA. However, the present disclosure is not limited thereto. The plurality of additional substrates 121 may be disposed in any area of the non-display area AA.

The plurality of first substrates 111 and the plurality of additional substrates 121 are rigid substrates and independently spaced apart from each other on the lower substrate 110. The plurality of first substrates 111 and the plurality of additional substrates 121 may be more rigid than the lower substrate 110. That is, the lower substrate 110 may be more ductile than the plurality of first substrates 111 and the plurality of additional substrates 121, and the plurality of first substrates 111 and the plurality of additional substrates 121 may be more rigid than the lower substrate 110.

The plurality of first substrates 111 and the plurality of additional substrates 121 as a plurality of rigid substrates may be formed of a plastic material having flexibility. The plurality of first substrates 111 and the plurality of additional substrates 121 may be formed of, for example, polyimide (PI), polyacrylate, polyacetate, or the like. In this case, the plurality of first substrates 111 may be formed of the same material as the plurality of additional substrates 121, but is not limited thereto. The first substrates 111 may also be formed of a different material from the plurality of additional substrates 121.

The plurality of first substrates 111 and the plurality of additional substrates 121 may have a higher modulus than that of the lower substrate 110. Herein, the modulus refers to an elastic modulus showing a ratio of deformation of a substrate to stress applied to the substrate, and when the modulus is relatively high, the hardness may be relatively high. Therefore, the plurality of first substrates 111 and the plurality of additional substrates 121 may be a plurality of rigid substrates having a higher rigidity than the lower substrate 110. The modulus of the plurality of first substrates 111 and the plurality of additional substrates 121 may be 1000 times or more than that of the lower substrate 110, but is not limited thereto.

In some embodiments, the lower substrate 110 includes a plurality of first lower patterns and a second lower pattern. The plurality of first lower patterns may be disposed in an area of the lower substrate 110 which overlaps the plurality of first substrates 111 and the plurality of additional substrates 121. Also, the second lower pattern may be disposed in an area excluding the area where the plurality of first substrates 111 and the plurality of additional substrates 121 are disposed. Otherwise, the second lower pattern may be disposed in the entire area of the stretchable display device 100.

In this case, the plurality of first lower patterns may have a higher modulus than that of the second lower pattern. For example, the plurality of first lower patterns may be formed of the same material as the plurality of first substrates 111. Also, the second lower pattern may be formed of a material having a lower modulus than that of the plurality of first substrates 111.

The COF 130 refers to a film formed by placing various components on a ductile base film 131 and is configured to supply signals to the plurality of sub-pixels in the display area AA. The COF 130 may be bonded to the plurality of pads of the plurality of additional substrates 121 disposed in the non-display area AA. The COF 130 may supply power voltage, data voltage, gate voltage, or the like through the pads to the plurality of respective sub-pixels disposed in the display area AA. The COF 130 may include the base film 131 and a drive IC 132 and may further include various components thereon.

The base film 131 serves to support the drive IC 132 of the COF 130. The base film 131 may be formed of an insulating material. For example, the base film 131 may be formed of an insulating material having flexibility.

The drive IC 132 is configured to process data for displaying an image and a drive signal for processing the data. FIG. 1 illustrates that the drive IC 132 is mounted by a method of the COF 130, but is not limited thereto. The drive IC 132 may also be mounted by a Chip On Glass (COG) method, a Tape Carrier Package (TCP) method or the like.

FIG. 1 illustrates that one third substrate 121 is disposed in the non-display area NA on the left side of the display area AA so as to correspond to the first substrates 111 in a row disposed in the display area AA, and one COF 130 is disposed for one third substrate 121. However, the present disclosure is not limited thereto. That is, one third substrate 121 and one COF 130 may be disposed so as to correspond to first substrates 111 in a plurality of rows.

In the printed circuit board 140, a control unit such as an IC chip, a circuit, or the like may be disposed. Further, in the printed circuit board 140, a memory, a processor, or the like may also be disposed. The printed circuit board 140 is configured to transfer a signal for driving the display elements from the control unit to the display elements. Although FIG. 1 illustrates that three printed circuit boards 140 are used, the number of printed circuit boards 140 is not limited thereto.

Hereafter, the stretchable display device 100 according to embodiments of the present disclosure will be described in more detail with reference to FIG. 2 and FIG. 3.

Planar and Cross-Sectional Structures

Figure 2:
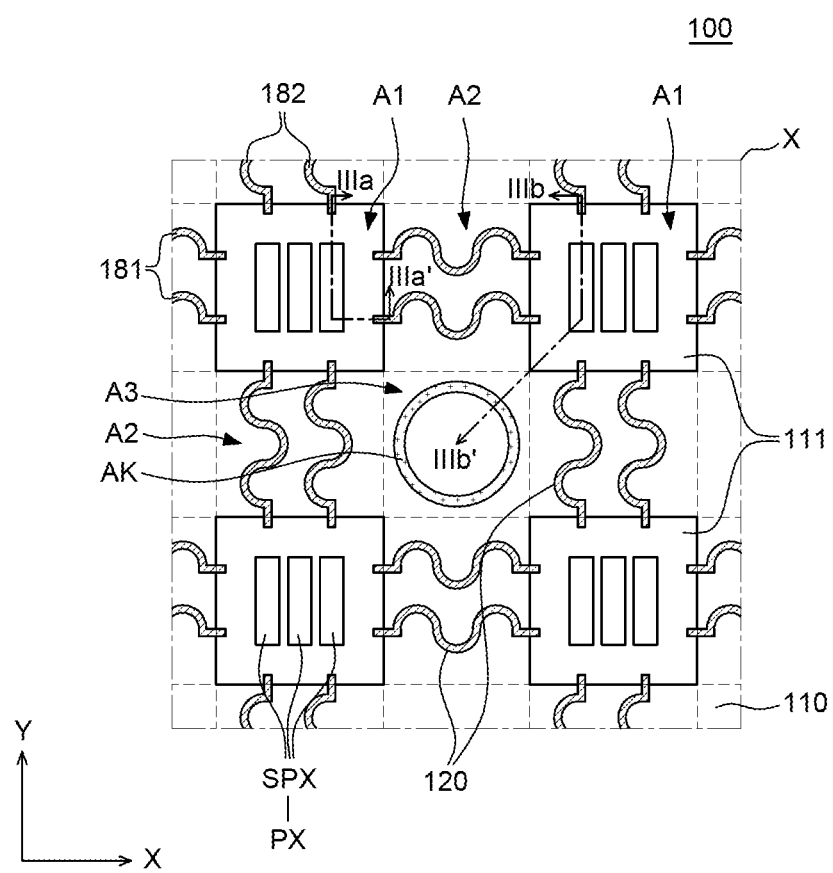
FIG. 2 is a schematic enlarged plan view of region X of FIG. 1.
Figure 3A:
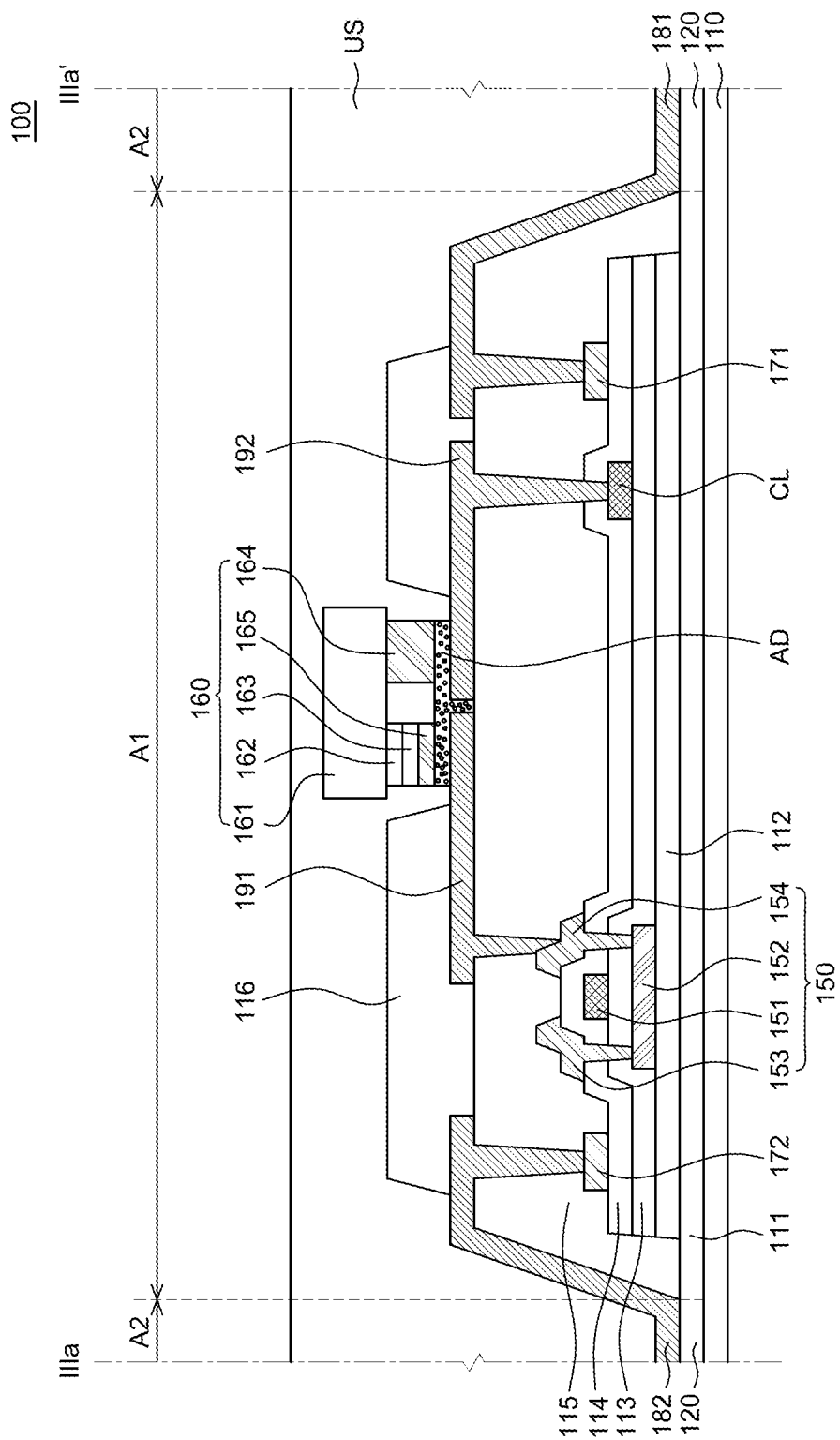
FIG. 3A is a schematic cross-sectional view of the stretchable display device according to embodiments of the present disclosure, taken along line IIIa-IIIa' of FIG. 2.
Figure 3B:
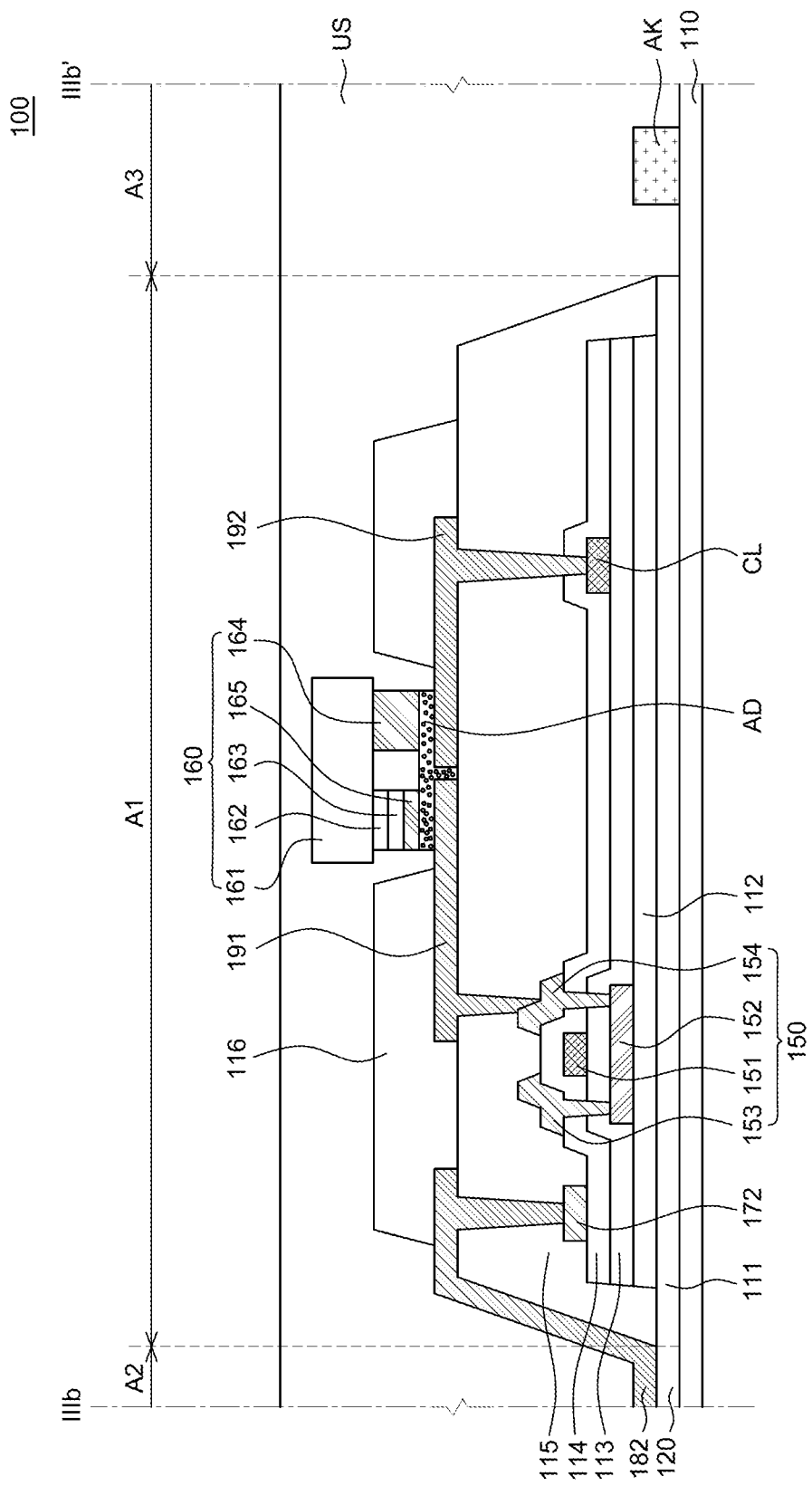
FIG. 3B is a schematic cross-sectional view of the stretchable display device according to embodiments of the present disclosure, taken along line IIIb-IIIb' of FIG. 2.

FIG. 2 is a schematic enlarged plan view of region X of FIG. 1. FIG. 3A is a schematic cross-sectional view of the stretchable display device according to embodiments of the present disclosure, taken along line IIIa-IIIa' of FIG. 2. FIG. 3B is a schematic cross-sectional view of the stretchable display device according to embodiments of the present disclosure, taken along line IIIb-IIIb' of FIG. 2.

Referring to FIG. 3A and FIG. 3B, the plurality of first substrates 111 is disposed on the lower substrate 110 in the display area AA. The plurality of first substrates 111 are disposed on the lower substrate 110 to be spaced apart from each other. For example, the plurality of first substrates 111 may be disposed in a matrix form on the lower substrate 110 as shown in FIG. 1 and FIG. 2, but are not limited thereto.

Referring to FIG. 1 and FIG. 2, a plurality of sub-pixels SPX constituting a plurality of pixels PX may be disposed in the plurality of first substrates 111. Further, gate drivers GD may be mounted on additional substrates 121 located on the upper and lower sides of the display area AA among the plurality of additional substrates 121. The gate drivers GD may be formed on the additional substrates 121 by a Gate In Panel (GIP) method when various components are manufactured on the first substrates 111. Thus, various circuit components, such as various transistors, capacitors, and lines, constituting the gate drivers GD may be disposed on the plurality of additional substrates 121. However, the present disclosure is not limited thereto. The gate drivers GD may be mounted by a COF method. In addition, the plurality of additional substrates 121 may be disposed in the non-display area AA on either of the upper and lower sides of the display area AA.

Referring to FIG. 1, the plurality of additional substrates 121 may have a size greater than that of the plurality of first substrates 111. Specifically, each of the plurality of additional substrates 121 may have a size greater than that of each of the plurality of first substrates 111. As described above, the gate drivers GD are disposed on the plurality of additional substrates 121, respectively. For example, a single stage of the gate driver GD may be disposed on each of the plurality of additional substrates 121. Therefore, the area of various circuit components constituting a single stage of the gate driver GD is relatively greater than that of the first substrate 111 in which the pixels PX are disposed. Accordingly, each of the plurality of additional substrates 121 may have a size greater than that of each of the plurality of first substrates 111.

Referring to FIG. 1 and FIG. 2, the plurality of second substrates 120 may be disposed between the plurality of first substrates 111 or between the plurality of additional substrates 121. Otherwise, the plurality of second substrates 120 may be disposed between the plurality of first substrates 111 and the plurality of additional substrates 121. The plurality of second substrates 120 serve to connect the first substrates 111 adjacent to each other, the additional substrates 121 adjacent to each other, or the first substrates 111 and the additional substrates 121 adjacent to each other. Thus, the plurality of second substrates 120 can be referred to as connection substrates. The plurality of second substrates 120 may be formed of the same material as the first substrates 111 or the additional substrates 121 and may be formed integrally with the first substrates 111 or the additional substrates 121 at the same time.

Referring to FIG. 1 and FIG. 2, the plurality of second substrates 120 are formed to be curved. For example, as shown in FIG. 1 and FIG. 2, the plurality of second substrates 120 may have a sine wave shape. However, the shape of the plurality of second substrates 120 is not limited thereto. For example, the plurality of second substrates 120 may be variously shaped. The plurality of second substrates 120 may be extended in a zigzag manner, or a plurality of diamond-shaped second substrates 120 may be extended by being connected to each other at their vertices. The number and shape of the plurality of second substrates 120 shown in FIG. 2 is provided by way of example. The number and shape of the plurality of second substrates 120 may vary depending on the design thereof.

Referring to FIG. 3A and FIG. 3B, a buffer layer 112 is disposed on the plurality of first substrates 111. The buffer layer 112 is formed on the plurality of first substrates 111 to protect various components of the stretchable display device 100 against permeation of moisture ($H_2O$), oxygen ($O_2$), and the like from the outside of the lower substrate 110 and the plurality of first substrates 111. The buffer layer 112 may be formed of an insulating material. For example, the buffer layer 112 may be formed of a single inorganic layer or multiple inorganic layers of silicon nitride (SiNx), silicon oxide (SiOx), silicon oxynitride (SiON), or the like. However, the buffer layer 112 may be omitted depending on a structure or characteristics of the stretchable display device 100.

In this case, the buffer layer 112 may be formed only in an area overlapping the plurality of first substrates 111 and the plurality of additional substrates 121. As described above, the buffer layer 112 may be formed of an inorganic material. Thus, the buffer layer 112 may be easily damaged, such as being cracked, while the stretchable display device 100 is stretched. Therefore, the buffer layer 112 may not be formed between the plurality of first substrates 111 and the plurality of additional substrates 121. The buffer layer 112 may be patterned into shapes of the plurality of first substrates 111 and the plurality of additional substrates 121 and formed only on upper portions of the plurality of first substrates 111 and the plurality of additional substrates 121. Accordingly, in the stretchable display device 100 according to embodiments of the present disclosure, the buffer layer 112 is formed only in the area overlapping the plurality of first substrates 111 and the plurality of additional substrates 121 which are rigid substrates. Thus, it is feasible to prevent damage to the buffer layer 112 even when the stretchable display device 100 is deformed, such as being bent or stretched.

Referring to FIG. 3A and FIG. 3B, a transistor 150 including a gate electrode 151, an active layer 152, a source electrode 153, and a drain electrode 154 is formed on the buffer layer 112.

First, the active layer 152 is disposed on the buffer layer 112. For example, the active layer 152 may be formed of an oxide semiconductor or may be formed of amorphous silicon (a-Si), polycrystalline silicon (poly-Si), an organic semiconductor, or the like.

A gate insulating layer 113 is disposed on the active layer 152. The gate insulating layer 113 serves as a layer for electrically insulating the gate electrode 151 and the active layer 152 and may be formed of an insulating material. For example, the gate insulating layer 113 may be formed of a single layer or multiple layers of silicon nitride (SiNx) or silicon oxide (SiOx) which is an inorganic material, but is not limited thereto.

The gate electrode 151 is disposed on the buffer layer 112. The gate electrode 151 is disposed to overlap the active layer 152. The gate electrode 151 may be formed of any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but is not limited thereto.

An interlayer insulating layer 114 is disposed on the gate electrode 151. The interlayer insulating layer 114 serves to insulate the gate electrode 151 from the source electrode 153 and the drain electrode 154 and may be formed of an inorganic material like the buffer layer 112. For example, the interlayer insulating layer 114 may be formed of a single layer or multiple layers of silicon nitride (SiNx) or silicon oxide (SiOx) which is an inorganic material, but is not limited thereto.

The source electrode 153 and the drain electrode 154 in contact with the active layer 152 are disposed on the interlayer insulating layer 114. The source electrode 153 and the drain electrode 154 are disposed on the same layer to be spaced apart from each other. The source electrode 153 and the drain electrode 154 may be electrically connected to the active layer 152 to be in contact with the active layer 152. The source electrode 153 and the drain electrode 154 may be formed of one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof.

Further, the gate insulating layer 113 and the interlayer insulating layer 114 may be patterned and formed only in an area overlapping the plurality of first substrates 111. The gate insulating layer 113 and the interlayer insulating layer 114 may also be formed of an inorganic material like the buffer layer 112. Thus, the gate insulating layer 113 and the interlayer insulating layer 114 may be easily damaged, such as being cracked, while the stretchable display device 100 is stretched. Therefore, the gate insulating layer 113 and the interlayer insulating layer 114 may not be formed between the plurality of first substrates 111. The gate insulating layer 113 and the interlayer insulating layer 114 may be patterned into the shape of the plurality of first substrates 111 and formed only on the plurality of first substrates 111.

For convenience of explanation, FIG. 3A and FIG. 3B illustrate only a driving transistor among various transistors which can be included in the stretchable display device 100. However, a switching transistor, a capacitor and the like can also be included in the stretchable display device. Further, in the present disclosure, the transistor 150 is described as having a coplanar structure, but various types of transistor having a staggered structure and the like may also be used.

Referring to FIG. 3A and FIG. 3B, a plurality of pads 170 are disposed on the interlayer insulating layer 114. Specifically, a gate pad 171 among the plurality of pads 170 is disposed on the interlayer insulating layer 114. The gate pad 171 serves to transfer gate signals to the plurality of sub-pixels SPX. The gate signal may be transferred from the gate pad 171 to the gate electrode 151 through a gate line formed on the first substrate 111. The gate pad 171 may be formed of the same material as the source electrode 153 and the drain electrode 154, but is not limited thereto.

Referring to FIG. 3A and FIG. 3B, a data pad 172 among the plurality of pads 170 is disposed on the interlayer insulating layer 114. The data pad 172 serves to transfer data signals to the plurality of sub-pixels SPX. The data signal may be transferred from the data pad 172 to the source electrode 153 or the drain electrode 154 through a data line formed on the first substrate 111. The data pad 172 may be formed of the same material as the source electrode 153 and the drain electrode 154, but is not limited thereto. In some embodiments, the plurality of pads 170 include gate pads 171 and data pads 172.

Referring to FIG. 3A and FIG. 3B, a planarization layer 115 is formed on the transistor 150 and the interlayer insulating layer 114. The planarization layer 115 serves to flatten an upper portion of the transistor 150. The planarization layer 115 may be formed of a single layer or multiple layers and formed of an organic material. For example, the planarization layer 115 may be formed of an acryl-based organic material, but is not limited thereto.

Referring to FIGS. 3A and 3B, the planarization layer 115 is disposed on the plurality of first substrates 111 to cover upper surfaces and side surfaces of the buffer layer 112, the gate insulating layer 113, and the interlayer insulating layer 114. Also, the planarization layer 115, together with the plurality of first substrates 111, surrounds the buffer layer 112, the gate insulating layer 113, and the interlayer insulating layer 114. Specifically, the planarization layer 115 may be disposed to cover an upper surface and a side surface of the interlayer insulating layer 114, a side surface of the gate insulating layer 113, a side surface of the buffer layer 112, and a portion of upper surfaces of the plurality of first substrates 111. Thus, the planarization layer 115 may compensate for steps on the side surfaces of the buffer layer 112, the gate insulating layer 113, and the interlayer insulating layer 114. Also, the planarization layer 115 may enhance adhesion strength between the planarization layer 115 and connection lines 180 disposed on a side surface of the planarization layer 115.

In some embodiments, a passivation layer may be formed between the transistor 150 and the planarization layer 115. That is, the passivation layer covering the transistor 150 may be formed to protect the transistor 150 from permeation of moisture, oxygen, and the like. The passivation layer may be formed of an inorganic material and formed of a single layer or multiple layers, but is not limited thereto.

Referring to FIG. 3A and FIG. 3B, a common line CL is disposed on the gate insulating layer 113. The common line CL serves to apply a common voltage to the plurality of sub-pixels SPX. The common line CL may be formed of the same material as the gate electrode 151 of the transistor 150, but is not limited thereto.

Referring to FIG. 2 and FIGS. 3A and 3B, the connection lines 180 refer to lines that electrically connect the pads 170 on the plurality of first substrates 111 or the plurality of additional substrates 121. The connection lines 180 are disposed on the first substrate 111 and the plurality of second substrates 120.

The connection lines 180 include a first connection line 181 and a second connection line 182. The first connection line 181 and the second connection line 182 are disposed between the plurality of first substrates 111. Specifically, the first connection line 181 refers to a line extending in an X-axis direction between the plurality of first substrates 111 among the connection lines 180. The second connection line 182 refers to a line extending in a Y-axis direction between the plurality of first substrates 111 among the connection lines 180.

The connection lines 180 may be formed of a metal material such as copper (Cu), aluminum (Al), titanium (Ti), or molybdenum (Mo). Otherwise, the connection lines 180 may have a stacked structure of metal materials such as copper/molybdenum-titanium (Cu/MoTi), titanium/aluminum/titanium (Ti/Al/Ti), or the like, but are not limited thereto.

In a general organic light-emitting display device, various lines such as a plurality of gate lines and a plurality of data lines extend in straight lines and are disposed between a plurality of sub-pixels. Also, the plurality of sub-pixels are connected to a single signal line. Therefore, in the general organic light-emitting display device, various lines such as a gate line, a data line, a high potential power line, and a reference voltage line, continuously extend on a substrate from one side to the other side of the organic light-emitting display device.

However, in the stretchable display device 100 according to embodiments of the present disclosure, various lines such as a gate line, a data line, a high potential power line, and a reference voltage line which are formed in straight lines and considered to be used in the general organic light-emitting display device, are disposed only on the plurality of first substrates 111 and the plurality of additional substrates 121. That is, in the stretchable display device 100 according to embodiments of the present disclosure, various lines formed in straight lines are disposed only on the plurality of first substrates 111 and the plurality of additional substrates 121.

In the stretchable display device 100 according to embodiments of the present disclosure, the pads on two adjacent first substrates 111 or additional substrates 121 may be connected to each other by the connection lines 180, so as to connect discontinuous lines on the first substrates 111 or additional substrates 121. That is, the connection lines 180 electrically connect the pads on the two adjacent first substrates 111, the two adjacent additional substrates 121, and the first substrate 111 and the third substrate 121 adjacent to each other. Therefore, the stretchable display device 100 according to embodiments of the present disclosure may include the plurality of connection lines 180 so as to electrically connect various lines, such as a gate line, a data line, a high potential power line, and a reference voltage line, between the plurality of first substrates 111, between the plurality of additional substrates 121, and between the plurality of first substrates 111 and the plurality of additional substrates 121. For example, a gate line may be disposed on the plurality of first substrates 111 disposed adjacent to each other in the X-axis direction and the gate pads 171 may be disposed on both ends of the gate line. In this case, a plurality of gate pads 171 on the plurality of first substrates 111 disposed adjacent to each other in the X-axis direction may be connected to each other by the first connection line 181 serving as the gate line. Therefore, the gate line disposed on the plurality of first substrates 111 and the first connection line 181 disposed on the third substrate 121 may serve as a single gate line. Further, lines, for example, a light emission signal line, a low potential power line, a high potential power line, which extend in the X-axis direction among all of various lines capable of being included in the stretchable display device 100, may also be electrically connected by the first connection line 181 as described above.

Referring to FIG. 2 and FIGS. 3A and 3B, the first connection line 181 may connect pads on two first substrates 111 disposed adjacent to each other among the pads on the plurality of first substrates 111 disposed adjacent to each other in the X-axis direction. The first connection line 181 may serve as a gate line, a light emission signal line, a high potential power line, or a low potential power line, but is not limited thereto. For example, the first connection line 181 may serve as a gate line and electrically connect the gate pads 171 on the two first substrates 111 disposed adjacent to each other in the X-axis direction. Therefore, as described above, the gate pads 171 on the plurality of first substrates 111 disposed adjacent to each other in the X-axis direction may be connected by the first connection line 181 serving as a gate line. A gate signal may be transferred to the gate pads 171.

Referring to FIG. 2, the second connection line 182 may connect the pads on two first substrates 111 disposed adjacent to each other among the pads on the plurality of first substrates 111 disposed adjacent to each other in the Y-axis direction. The second connection line 182 may serve as a data line, a high potential power line, a low potential power line, or a reference voltage line, but is not limited thereto. For example, the second connection line 182 may serve as a data line and electrically connect data lines DL on two first substrates 111 disposed adjacent to each other in the Y-axis direction. Therefore, as described above, the data lines DL on the plurality of first substrates 111 disposed adjacent to each other in the Y-axis direction may be connected by a plurality of second connection lines 182 serving as data lines. A data signal may be transferred to the data lines DL.

Referring to FIG. 1, the connection lines 180 may further include a line that connect the pads on the plurality of first substrates 111 and the plurality of additional substrates 121 or connect the pads on two additional substrates 121 disposed adjacent to each other among the plurality of additional substrates 121 disposed adjacent to each other in the Y-axis direction.

The first connection line 181 is in contact with an upper surface and a side surface of the planarization layer 115 disposed on the first substrate 111 and may extend to an upper surface of the second substrate 120. Also, the second connection line 182 is in contact with the upper surface and the side surface of the planarization layer 115 disposed on the first substrate 111 and may extend to the upper surface of the second substrate 120.

Referring to FIG. 3A and FIG. 3B, a bank 116 is formed on a first connection pad 191, a second connection pad 192, the connection lines 180, and the planarization layer 115. The bank 116 is a component to distinguish adjacent sub-pixels SPX from each other.

The bank 116 is disposed to cover a portion of the first connection pad 191 and the second connection line 182 adjacent thereto or at least a portion of the second connection pad 192 and the first connection line 181. The bank 116 may be formed of an insulating material. Further, the bank 116 may include a black material. Since the bank 116 includes a black material, the bank 116 serves to hide lines which are visible through the display area AA. The bank 116 may be formed of, for example, a transparent carbon-based mixture. Specifically, the bank 116 may include carbon black, but is not limited thereto. The bank 116 may also be formed of a transparent insulating material.

Referring to FIG. 3A and FIG. 3B, an LED 160 is disposed on the first connection pad 191 and the second connection pad 192. The LED 160 may be transferred on the first substrate 111 through a transfer process. The LED 160 includes an n-type layer 161, an active layer 162, a p-type layer 163, an n-electrode 164, and a p-electrode 165. The LED 160 of the stretchable display device 100 according to embodiments of the present disclosure has a flip-chip structure in which the n-electrode 164 and the p-electrode 165 are formed on one surface thereof.

The n-type layer 161 may be formed by injecting n-type impurities into gallium nitride (GaN) having excellent crystallinity. The n-type layer 161 may be disposed on a separate base substrate which is formed of a light-emitting material.

The active layer 162 is disposed on the n-type layer 161. The active layer 162 is a light-emitting layer in the LED 160 and may be formed of a nitride semiconductor, for example, indium gallium nitride (InGaN). The p-type layer 163 is disposed on the active layer 162. The p-type layer 163 may be formed by injecting p-type impurities into gallium nitride (GaN).

The LED 160 according to embodiments of the present disclosure is manufactured by sequentially stacking the n-type layer 161, the active layer 162, and the p-type layer 163, etching a predetermined area thereof, and forming the n-electrode 164 and the p-electrode 165. In this case, the predetermined area is a space to separate the n-electrode 164 and the p-electrode 165 from each other and is etched to expose a portion of the n-type layer 161. In other words, surfaces of the LED 160 on which the n-electrode 164 and the p-electrode 165 are to be disposed may not be flat and may have different levels of height.

The n-electrode 164 is disposed on the etched area, i.e., on the n-type layer 161 which is exposed by etching. The n-electrode 164 may be formed of a conductive material. Meanwhile, the p-electrode 165 is disposed on a non-etched area, i.e., on the p-type layer 163. The p-electrode 165 may be formed of a conductive material. For example, the p-electrode 165 may be formed of the same material as the n-electrode 164.

An adhesive layer AD is disposed on upper surfaces of the first connection pad 191 and the second connection pad 192 and between the first connection pad 191 and the second connection pad 192. Thus, the LED 160 can be bonded onto the first connection pad 191 and the second connection pad 192. In this case, the n-electrode 164 may be disposed on the second connection pad 192 and the p-electrode 165 may be disposed on the first connection pad 191.

The adhesive layer AD may be a conductive adhesive layer formed by dispersing conductive balls in an insulating base member. Thus, when heat or pressure is applied to the adhesive layer AD, the conductive balls are electrically connected to have conductive properties in a portion of the adhesive layer AD to which heat or pressure is applied. And, an area of the adhesive layer AD to which pressure is not applied may have insulating properties. For example, the n-electrode 164 is electrically connected to the second connection line 182 through the adhesive layer AD, and the p-electrode 165 is electrically connected to the first connection line 181 through the adhesive layer AD. That is, after applying the adhesive layer AD to the first connection pad 191 and the second connection pad 192 by an inkjet method or other methods, the LED 160 may be transferred onto the adhesive layer AD. Then, the LED 160 may be pressed and heated to thereby electrically connect the first connection pad 191 to the p-electrode 165 and the second connection pad 192 to the n-electrode 164. However, other portions of the adhesive layer AD excluding a portion of the adhesive layer AD between the n-electrode 164 and the second connection pad 192 and a portion of the adhesive layer AD between the p-electrode 165 and the first connection pad 191 have insulating properties. Alternatively, the adhesive layer AD may be separately disposed on each of the first connection pad 191 and the second connection pad 192.

As described above, the stretchable display device 100 according to embodiments of the present disclosure has a structure in which the LED 160 is disposed on the lower substrate 110 in which the transistor 150 is disposed. Thus, when the stretchable display device 100 is turned on, different levels of voltage applied to each of the first connection pad 191 and the second connection pad 192 are transferred to the n-electrode 164 and the p-electrode 165, so that the LED 160 emits light.

Referring to FIG. 3A and FIG. 3B, an upper substrate US is disposed on the bank 116, the LED 160, and the lower substrate 110.

The upper substrate US serves to support various components disposed under the upper substrate US. Specifically, the upper substrate US may be formed by coating and hardening a material configuring the upper substrate US on the lower substrate 110 and the plurality of first substrates 111. The upper substrate US may be disposed to be in contact with the lower substrate 110, the plurality of first substrates 111, the plurality of second substrates 120, and a plurality of third areas A3.

The upper substrate US is a flexible substrate and may be formed of a bendable or stretchable insulating material. The upper substrate US is a flexible substrate and may be reversibly expandable and contractible. Further, the upper substrate US may have an elastic modulus of several MPa to several hundreds of MPa, for example, 0.7 MPa to 1 MPa. In addition, the upper substrate US may have a breaking elongation of 100% or more. A thickness of the upper substrate US may be from 10 μm to 1 mm, but is not limited thereto.

The upper substrate US may be formed of the same material as the lower substrate 110. For example, the upper substrate US may be formed of silicone rubber such as polydimethylsiloxane (PDMS) and an elastomer such as polyurethane (PU), and polytetrafluoroethylene (PTFE) or the like. Thus, the upper substrate US may have flexibility. However, the materials of the upper substrate US are not limited thereto.

Meanwhile, although not illustrated in FIG. 3A and FIG. 3B, a polarizing layer may also be disposed on the upper substrate US. The polarizing layer polarizes light incident from the outside of the stretchable display device 100 and reduces reflection of external light. Further, instead of the polarizing layer, other optical films or the like may be disposed on the upper substrate US.

Referring to FIG. 2, a plurality of first areas A1 in which the plurality of first substrates 111 are disposed, a plurality of second areas A2 in which the connection lines 180 are disposed, and the plurality of third areas A3 from which the first areas A1 and the second areas A2 are excluded and in which a plurality of align keys AK may be disposed are formed on the lower substrate 110 of the stretchable display device 100.

Referring to FIG. 2, the plurality of first areas A1 are areas where the plurality of first substrates 111 are disposed, and have rigidity. The plurality of first areas A1 are spaced apart from each other and formed on the lower substrate 110. For example, as shown in FIG. 2, the plurality of first areas A1 may be disposed in a matrix form on the lower substrate 110, but are not limited thereto.

Referring to FIG. 2, the plurality of second areas A2 are adjacent to the plurality of first areas A1. Specifically, the plurality of second areas A2 are between two first areas A1 adjacent to each other. Accordingly, as illustrated in FIG. 2, the plurality of second areas A2 are on the upper, lower, left, and right sides of the first areas A1. The plurality of second areas A2 are line areas where the connection lines 180 are disposed, and have ductility. The plurality of second areas A2 are stretchable when stretching the stretchable display device 100. The plurality of second areas A2 are spaced apart from each other and formed on the lower substrate 110. For example, as illustrated in FIG. 2, the plurality of second areas A2 may be disposed in a matrix form on the lower substrate 110, but are not limited thereto.

Referring to FIG. 2 and FIG. 3B, the plurality of third areas A3 are in portions surrounded by the plurality of first areas A1 and the plurality of second areas A2. Referring to FIG. 2, the second areas A2 are on upper, lower, right, and left sides of each of the plurality of third areas A3, and the first areas A1 are adjacent to each of the plurality of third areas A3 in four diagonal directions. The plurality of third areas A3 are align key areas where a plurality of align keys AK are disposed, and have ductility. The plurality of third areas A3 are stretchable when stretching the stretchable display device 100.

The plurality of align keys AK are used to accurately position the LED 160 in a process of transferring the LED 160 to the first substrate 111. The plurality of align keys AK are disposed to be in contact with the lower substrate 110. Specifically, one of the plurality of align keys AK is disposed in one of the plurality of third areas A3 and disposed on the lower substrate 110. The third areas A3 are areas where the first substrates 111 or the connection lines 180 are not disposed, and may be dummy areas having no function. Accordingly, by disposing the plurality of align keys AK in the plurality of third areas A3, the area of the stretchable display device 100 can be effectively utilized.

The plurality of align keys AK may be disposed such that central portions of the plurality of align keys AK are aligned with the centers of the plurality of third areas A3, but are not limited thereto. In addition, the plurality of align keys AK may not be disposed in all of the plurality of third areas A3, and may be disposed only in a portion of the plurality of third areas A3.

The plurality of align keys AK may be formed of an elastic material. The align keys AK may include a base resin having elasticity and reflective particles dispersed in the base resin.

The base resin can be formed of a bendable or stretchable insulating material. For example, the base resin may be formed of silicone rubber such as polydimethylsiloxane (PDMS) and an elastomer such as polyurethane (PU), polytetrafluoroethylene (PTFE) or the like. Thus, base resin may have flexibility. In addition, the base resin may be formed of the same material as the upper substrate US and the lower substrate 110. However, the material of the base resin is not limited thereto.

The base resin may be reversibly expandable and contractible. In addition, the base resin may be formed of a material having a modulus equal to or less than that of the lower substrate 110. For example, the base resin may have an elastic modulus of 0.5 MPa to 1 MPa. Accordingly, the modulus of the plurality of align keys AK may be less than or equal to the modulus of the lower substrate 110.

The stretchable display device 100 according to embodiments of the present disclosure includes the upper substrate US. At this time, the upper substrate US covers the lower substrate 110, and the first substrate 111, the second substrate 120, and the plurality of align keys AK which are disposed on the lower substrate 110. The plurality of align keys AK are disposed to be in contact with the lower substrate 110 and the upper substrate US.

In this case, the modulus of the upper substrate US may be the same as the modulus of the lower substrate 110. Accordingly, the modulus of the plurality of align keys AK may be equal to or less than that of the lower substrate 110 and the upper substrate US. The reflective particles may include at least one of silver (Ag) nanoparticles, silver nanowires, and silver flakes. Since the align keys AK do not have to be conductive, the reflective particles are not necessarily conductive, but they should be recognized by being reflected during a transfer process of the LED 160. Thus, the reflective particles can be metallic particles.

The plurality of align keys AK may have a circular shape. As described above, since the plurality of third areas A3 are areas which are stretchable when stretching the stretchable display device 100, it is preferable for the plurality of align keys AK to have a circular shape which is advantageous for stretching in all directions. However, embodiments of the present disclosure are not limited thereto, and the shape of the align key AK may be various, such as an ellipse shape, a polygonal shape, a cross shape, and the like. When the plurality of align keys AK have a circular shape, a thickness of the align keys AK may be about 0.5 to 1 µm, and a width of a line forming a circle may be about 10 to 20 µm. However, embodiments of the present disclosure are not limited thereto.

A size of the align key AK may be smaller than a size of the third area A3. That is, a maximum width of the align key AK may be smaller than a width in the X-axis direction and a width in the Y-axis direction of the third area A3.

In the case of a display device using an LED as a light emitting element, a micro unit of LED, that is, a micro-LED is used to increase resolution. In this case, after manufacturing the LED on a wafer, processes of primarily transferring the LED from the wafer to a donor, and secondarily transferring the LED from the donor to a substrate to thereby place the LED on the substrate are used. In this case, in the process of transferring the LED from the donor to the substrate, align keys are used so that the LED is aligned at an exact position and is transferred. The align keys are disposed on the substrate and the donor, respectively, and after aligning the align keys disposed on the substrate and the align keys disposed on the donor, the process of transferring the LED is used.

To simplify a process of manufacturing the align keys disposed on the substrate, a process of forming the align keys, simultaneously with forming conductive components to be formed on the substrate is used. For example, a process of simultaneously forming the align keys when forming components such as thin film transistors, capacitors, and lines to be disposed on a substrate, is used. However, these conductive components are mainly metals, which are rigid materials. In the case of a general display device, the display device is not stretched or deformed, but a stretchable display device has to be freely stretched by a user. Accordingly, when an align key formed of metal is used to be disposed on a lower substrate in the stretchable display device, since the align key is more rigid than the lower substrate which is easily stretched during stretching of the stretchable display device, the align key may crack. When the align key cracks as described above, various lines, circuit components, and LEDs around the align key may be affected, leading to a defect in the stretchable display device. Consequently, reliability of the stretchable display device may be lowered.

Accordingly, in the stretchable display device 100 according to embodiments of the present disclosure, the align key AK is not formed simultaneously with various conductive components on the first substrate 111, and is formed immediately before the transfer process of the LED 160. That is, after the first connection pad 191, the second connection pad 192, and the connection lines 180 are formed but before the LED 160 is transferred, the align key AK is disposed in the third area A3. In addition, the align key AK may include a base resin having elasticity so that it can be stretched when the stretchable display device is stretched, and reflective particles dispersed in the base resin so that it can be recognized during the transfer process. Accordingly, in the stretchable display device 100 according to embodiments of the present disclosure, the align keys AK including the base resin formed of a material having elasticity so as to be stretchable, and the reflective particles that allow the align keys AK to be recognized during the transfer process, are used. Thus, an accurate transfer process of the LED 160 is feasible, and damage to the align keys AK when stretching the stretchable display device 100 is prevented, thereby improving reliability of the stretchable display device 100.

Transfer Unit Area and Align Key

Figure 4:
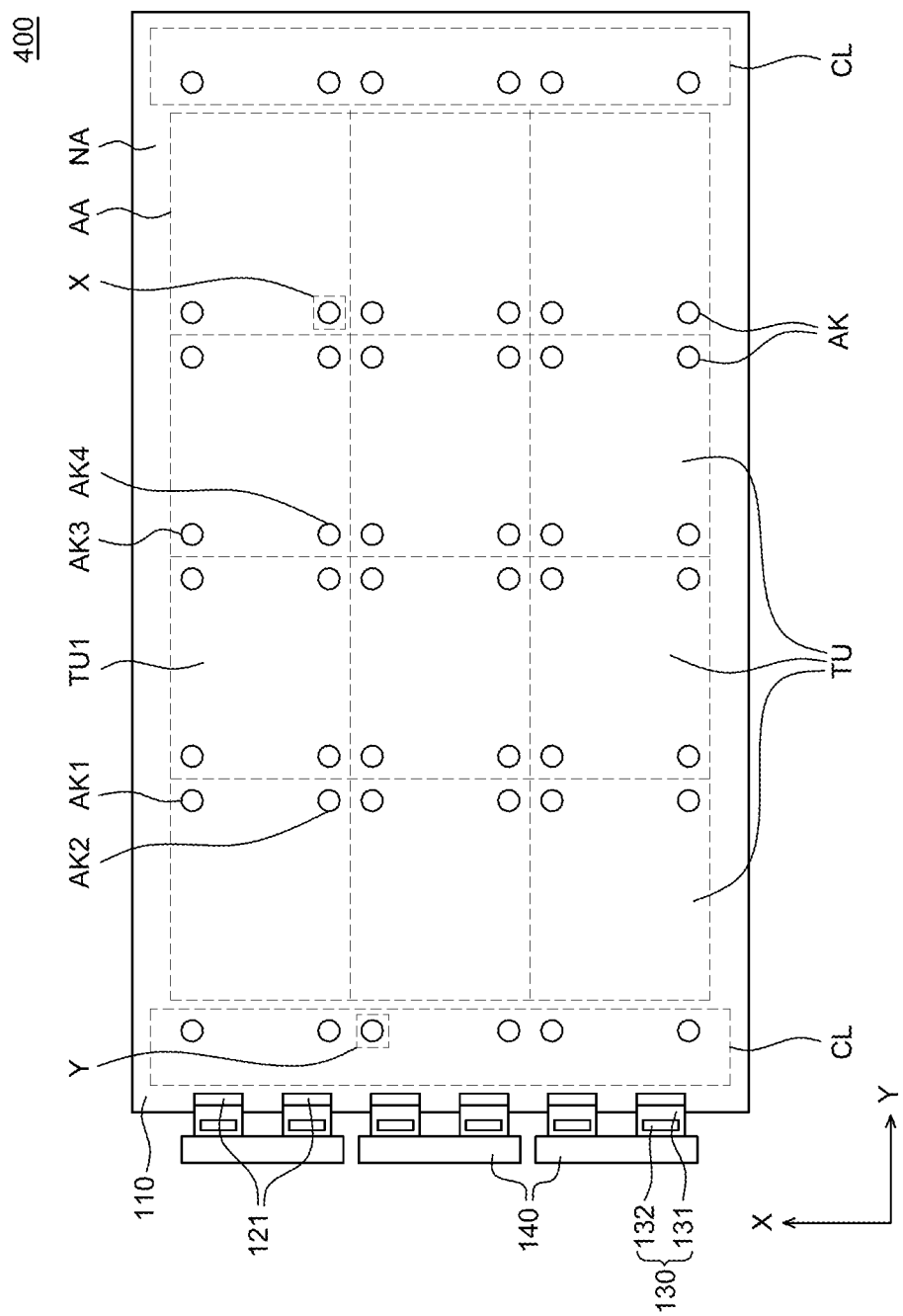
FIG. 4 is a schematic plan view of a stretchable display device according to another embodiment of the present disclosure.
Figure 5:
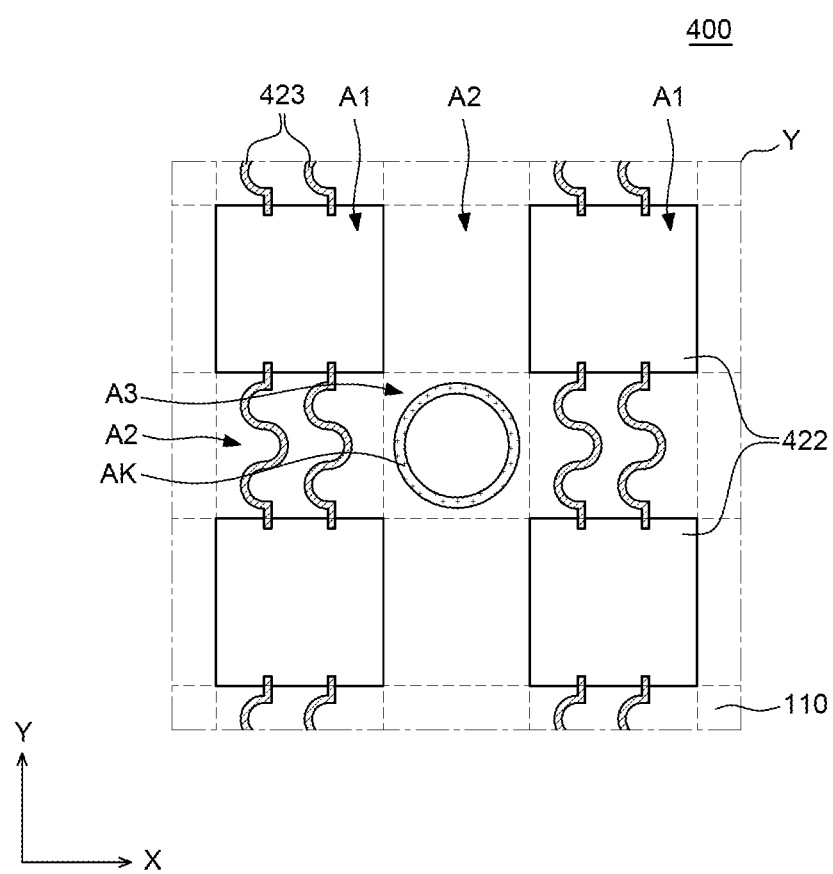
FIG. 5 is a schematic enlarged plan view of region Y of FIG. 4.

FIG. 4 is a schematic plan view of a stretchable display device according to another embodiment of the present disclosure. FIG. 5 is a schematic enlarged plan view of region Y of FIG. 4. A stretchable display device 400 shown in FIGS. 4 and 5 is substantially the same as the stretchable display device 100 shown in FIG. 1 through FIG. 3B except that it further includes a clamp CP, a plurality of third substrates 422, and a plurality of fourth substrates 423. Therefore, redundant description of the same components will be omitted.

Referring to FIG. 4, the display area AA of the lower substrate 110 includes a plurality of transfer unit areas TU. The transfer unit area TU means a unit area where transfer is performed in the process of actually transferring the LED 160. For example, in FIG. 4, the display area AA includes 12 transfer unit areas TU, which means that the LEDs 160 are transferred to the display area AA through a total of 12 transfer processes. However, the size, number, and arrangement of the transfer unit areas TU are not limited to the embodiment illustrated in FIG. 4.

Referring to FIG. 4, the plurality of align keys AK are disposed on both sides of each of the plurality of transfer unit areas TU. For example, a first align key AK1 and a second align key AK2 among the plurality of align keys AK are disposed on the left side of a first transfer unit area TU1 among the plurality of transfer unit areas TU. And, a third align key AK3 and a fourth align key AK4 among the plurality of align keys AK are disposed on the right side of the first transfer unit area TU1 among the plurality of transfer unit areas TU. Accordingly, when the LED 160 is transferred to the first transfer unit area TU1, a transfer process may be performed using the align keys AK disposed on the left and right sides of the first transfer unit area TU1. As the transfer process of the LED 160 is performed as described above, the align keys AK used during the transfer process of the LED 160 for a single transfer unit area TU may be disposed in transfer unit areas TU positioned on the both sides of the corresponding transfer unit area TU. Also, the plurality of align keys AK may be disposed in the display area AA such that four align keys AK may be adjacent to one another, two rows of align keys AK may be adjacent to each other, or two columns of align keys AK may be adjacent to each other. However, the number and positions of the align keys AK disposed on the left and right sides of one transfer unit area TU are not limited thereto.

Meanwhile, some of the align keys AK used when transferring the LED 160 to the leftmost or rightmost transfer unit area TU of the display area AA may be disposed in the non-display area NA. That is, the align key areas may be positioned in the display area AA, and the non-display area AA on both sides of the display area AA, on the flexible substrate including the display area AA and the non-display area NA surrounding the display area AA.

Referring to FIG. 5, in the non-display area NA on both sides of the display area AA on the lower substrate 110 of the stretchable display device 400, the plurality of first areas A1 where the plurality of third substrates 422 are disposed, the plurality of second areas A2 between the plurality of first areas A1, and the plurality of third areas A3 from which the first areas A1 and the second areas A2 are excluded and in which the plurality of align keys AK are disposed are formed. That is, the first area A1, the second area A2, and the third area A3 may be formed in an area between the COF 130 and one side of the display area AA and an area adjacent to the other side opposite to the one side of the display area AA, in the non-display area NA.

Referring to FIG. 5, the plurality of first areas A1 are areas where the plurality of third substrates 422 are disposed, and have rigidity. The plurality of first areas A1 are spaced apart from each other and formed on the lower substrate 110. For example, as shown in FIG. 5, the plurality of first areas A1 may be disposed in a matrix form on the lower substrate 110, but are not limited thereto. In this case, the third substrate 422 may have the same size as that of the first substrate 111. The third substrate 422 may be formed of the same material as the first substrate 111 and may be disposed on the same layer. Further, the pixel PX is not defined on the third substrate 422, and only an insulating layer or line may be disposed thereon. Therefore, the third substrate 422 may be disposed on the non-display area NA.

Referring to FIG. 5, the plurality of second areas A2 are adjacent to the plurality of first areas A1. Specifically, the plurality of second areas A2 are between two first areas A1 adjacent to each other. Accordingly, as illustrated in FIG. 5, the plurality of second areas A2 are located on the upper, lower, left, and right sides of the first areas A1.

The fourth substrate 423 connecting the third substrates 422 adjacent to each other or connecting the third substrate 422 and the first substrate 111 is disposed in the second area A2 disposed between two first areas A1 adjacent to each other in the Y-axis direction among the plurality of second areas A2. The fourth substrate 423 may be disposed on the non-display area NA, like the third substrate 422.

In addition, the connection lines 180 may be disposed on the fourth substrates 423, and the connection lines 180 may function to transmit signals between the COF 130 and the plurality of sub-pixels SPX located in the display area AA. In this case, the connection lines 180 disposed on the fourth substrates 423 may be electrically connected to each other through the line disposed on the third substrate 422. For example, the connection line 180 located on one side of the third substrate 422 and the connection line 180 located on the other side of the third substrate 422 may be connected to each other through the line disposed on the third substrate 422, thereby functioning as a single wire.

The fourth substrate 423 may not be disposed in the second area A2 disposed between two first areas A1 adjacent to each other in the X-axis direction among the plurality of second areas A2. That is, in some cases, since signals between the plurality of sub-pixels SPX and the COF 130 need to be transmitted only in the Y-axis direction, the connection line 180 may not be disposed in the X-axis direction. Thus, the fourth substrate 423 may not be disposed in the second area A2 disposed between the two first areas A1 adjacent to each other in the X-axis direction, but is not limited thereto.

Referring to FIG. 5, the plurality of third areas A3 are formed in portions surrounded by the plurality of first areas A1 and the plurality of second areas A2. Referring to FIG. 5, the second areas A2 are located on upper, lower, right, and left sides of each of the plurality of third areas A3, and the first areas A1 are adjacent to each of the plurality of third areas A3 in four diagonal directions. The plurality of third areas A3 are areas where the plurality of align keys AK are disposed. The plurality of third areas A3 have ductility and are stretchable when stretching the stretchable display device 400.

Referring to FIG. 4, the clamp CL is disposed on both sides of the display area AA. When the stretchable display device 400 is stretched, the clamp CL is a device provided to stretch the stretchable display device 400 in a state in which the stretchable display device 400 is grasped by a user, and may have a function similar to a handle.

The clamp CL may be disposed between the flexible film and the display area AA and overlap the plurality of third substrates 422 and the plurality of fourth substrates 423 disposed in the non-display area NA. Accordingly, the align keys AK disposed in the non-display area NA may also be disposed to overlap the clamp CL.

In the stretchable display device 400 according to another embodiment of the present disclosure, the align keys AK are not formed simultaneously with various conductive components on the first substrate 111 and are formed immediately before the transfer process of the LED 160. Also, the align key AK may include a base resin having elasticity so that it can be stretched when stretching the stretchable display device 400, and reflective particles dispersed in the base resin so that the align key AK can be recognized during the transfer process. Therefore, in the stretchable display device 400 according to another embodiment of the present disclosure, an accurate transfer process of the LED 160 is feasible, and damage to the align key AK when the stretchable display device 400 is stretched may be prevented. Thus, reliability of the stretchable display device 400 may be improved.

In addition, in the stretchable display device 400 according to another embodiment of the present disclosure, the align keys AK are disposed in an area where the clamp CL which is a device used to stretch the stretchable display device 400, is disposed. Thus, the align keys AK may be used without causing an increase in the non-display area NA of the stretchable display device 400. In some embodiments, the align keys AK used in the transfer process of the LED 160 is disposed in a portion of the non-display area NA. However, when an additional area is required to form the align keys in the non-display area, there is a problem in which a size of the non-display area NA increases. Accordingly, in the stretchable display device 400 according to another embodiment of the present disclosure, the align keys AK are disposed to overlap the clamp CL which is a device used in the stretchable display device 400 and thus, may be disposed without the use of an additional area.

Figure 6:
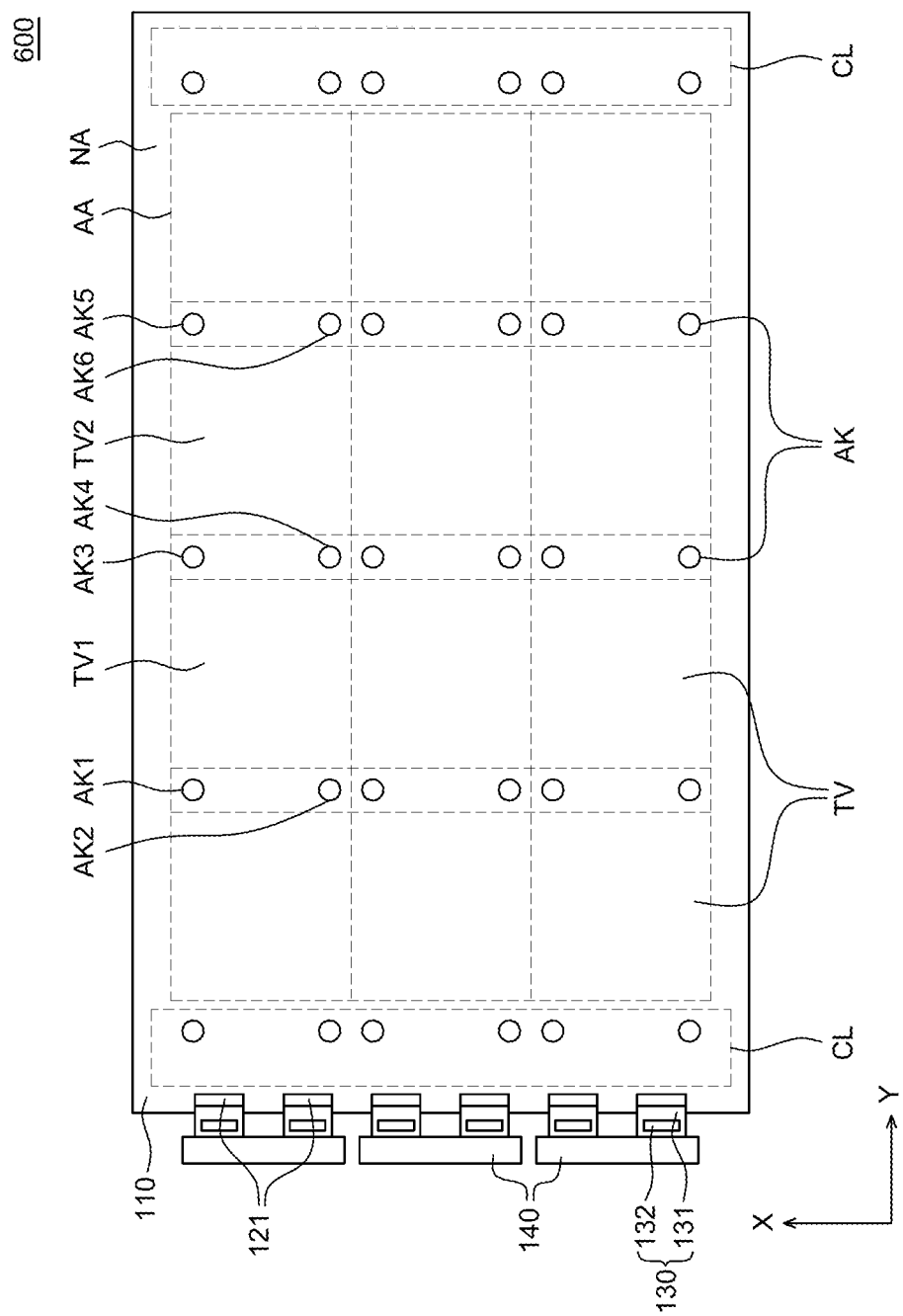
FIG. 6 is a schematic plan view of a stretchable display device according to still another embodiment of the present disclosure.

FIG. 6 is a schematic plan view of a stretchable display device according to still another embodiment of the present disclosure. A stretchable display device 600 illustrated in FIG. 6 is substantially the same as the stretchable display device 400 illustrated in FIGS. 4 and 5, except for transfer unit areas TV and align keys AK. Therefore, redundant description of the same components will be omitted.

Referring to FIG. 6, the display area AA of the lower substrate 110 includes a plurality of transfer unit areas TV. The plurality of align keys AK are disposed on both sides of each of the plurality of transfer unit areas TV. In this case, the plurality of align keys AK may be disposed between two transfer unit areas TV adjacent to each other among the plurality of transfer unit areas TV. For example, a first align key AK1 and a second align key AK2 among the plurality of align keys AK are disposed on the left side of a first transfer unit area TV1 among the plurality of transfer unit areas TV. And, a third align key AK3 and a fourth align key AK4 among the plurality of align keys AK are disposed on the right side of the first transfer unit area TV1 among the plurality of transfer unit areas TV. Further, a fifth align key AK5 and a sixth align key AK6 among the plurality of align keys AK are disposed on the right side of a second transfer unit area TV2 among the plurality of transfer unit areas TV. And, the third align key AK3 and the fourth align key AK4 are disposed on the left side of the second transfer unit area TV2. In this case, the third align key AK3 and the fourth align key AK4 may be disposed between the first transfer unit area TV1 and the second transfer unit area TV2. Also, the third align key AK3 and the fourth align key AK4 may be used during a transfer to the first transfer unit area TV1 and may also be used during a transfer to the second transfer unit area TV2. As the align keys AK are disposed as described above, the align keys AK may be disposed in the display area AA such that one line of align keys AK are disposed in the X-axis direction and two lines of align keys AK are disposed in parallel and adjacent to each other in the Y-axis direction. However, the number and positions of the align keys AK are not limited thereto.

In the stretchable display device 600 according to another embodiment of the present disclosure, the plurality of align keys AK are disposed between two transfer unit areas TV adjacent to each other among the plurality of transfer unit areas TV. Thus, a single align key AK can be used for both transfers to the transfer unit areas TV located on the left and right sides of the align key AK, and the number of align keys AK disposed on the lower substrate 110 can be reduced or minimized.

Even when the align key is formed of a material having elasticity, there exists a probability that the align key cracks and affects other components around it, compared to a case in which the align key is not used.

Accordingly, in the stretchable display device 600 according to another embodiment of the present disclosure, the plurality of align keys AK are disposed between two transfer unit areas TV adjacent to each other among the plurality of transfer unit areas TV, whereby one align key AK can be used in a plurality of transfer processes. Accordingly, the number of align keys AK may be reduced or minimized to thereby improve the reliability of the stretchable display device 600.

Stretchable Display Device Including Organic Light-Emitting Diode

Figure 7:
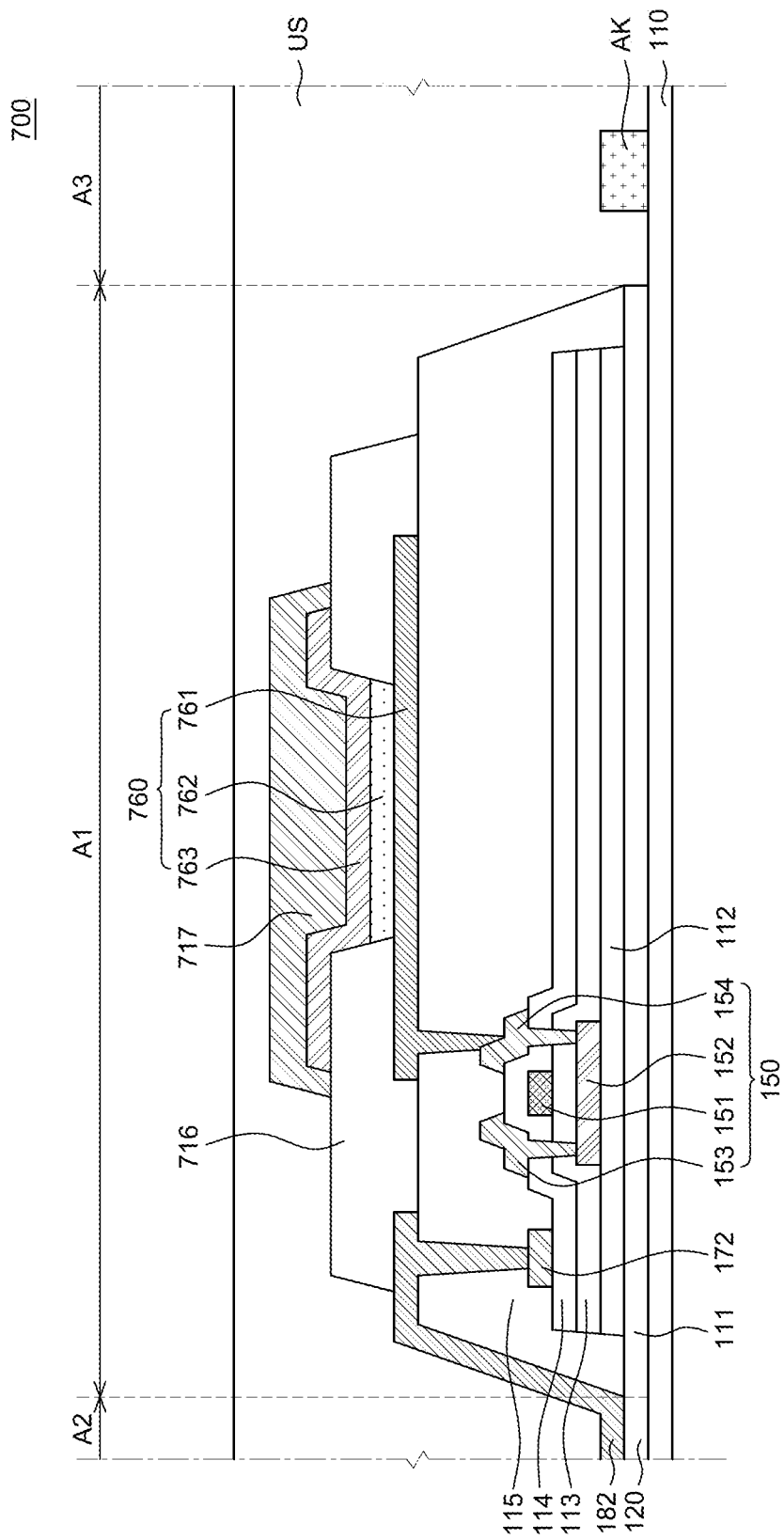
FIG. 7 is a schematic cross-sectional view of a stretchable display device according to still another embodiment of the present disclosure.

FIG. 7 is a schematic cross-sectional view of a stretchable display device 700 according to still another embodiment of the present disclosure. The stretchable display device 700 shown in FIG. 7 is substantially the same as the stretchable display device 100 shown in FIG. 1 through FIG. 3B except for an organic light-emitting diode (OLED) 760 and a bank 716. Therefore, redundant description of the same components will be omitted.

Referring to FIG. 7, the OLED 760 is disposed to correspond to each of the plurality of sub-pixels SPX and emits light in a specific wavelength range. That is, the OLED 760 may be a blue OLED that emits blue light, a red OLED that emits red light, a green OLED that emits green light, or a white OLED that emits white light, but is not limited thereto. If the OLED 760 is a white OLED, the stretchable display device 700 may further include a color filter.

The OLED 760 includes an anode 761, an organic emission layer 762, and a cathode 763. Specifically, the anode 761 is disposed on the planarization layer 115. The anode 761 is an electrode configured to supply holes to the organic emission layer 762. The anode 761 may be formed of a transparent conductive material having a high work function. Here, the transparent conductive material may include indium tin oxide (ITO), indium zinc oxide (IZO), and indium tin zinc oxide (ITZO). Further, if the stretchable display device 700 is a top emission type device, the anode 761 may further include a reflective plate.

The anode 761 is disposed separately for each sub-pixel SPX and electrically connected to the transistor 150 through a contact hole formed in the planarization layer 115. For example, FIG. 7 illustrates that the anode 761 is electrically connected to the drain electrode 154 of the transistor 150, but the anode 761 may be electrically connected to the source electrode 153.

The bank 716 is formed on the anode 761 and the planarization layer 115. The bank 716 is a component for distinguishing adjacent sub-pixels SPX from each other. The bank 716 is disposed to cover at least a portion of both sides of the anode 761 adjacent thereto and exposes a portion of an upper surface of the anode 761. The bank 716 may serve to prevent unintended light emission or color mixing of the sub-pixels SPX, which occurs when light is emitted in a lateral direction of the anode 761 due to concentration of current at edges of the anode 761. The bank 716 may be formed of acryl-based resin, benzocyclobutene (BCB)-based resin, polyimide, but is not limited thereto.

The organic emission layer 762 is disposed on the anode 761. The organic emission layer 762 is configured to emit light. The organic emission layer 762 may include a light emitting material, and the light-emitting material may include a phosphorescent material or a fluorescent material, but is not limited thereto.

The organic emission layer 762 may be formed of a single emission layer. Otherwise, the organic emission layer 762 may have a stacked structure in which a plurality of emission layers are stacked with a charge generation layer interposed therebetween. Further, the organic emission layer 762 may further include at least one organic layer of a hole transport layer, an electron transport layer, a hole block layer, an electron block layer, a hole injection layer, and an electron injection layer.

Referring to FIG. 7, the cathode 763 is disposed on the organic emission layer 762. The cathode 763 is configured to supply electrons to the organic emission layer 762. The cathode 763 may be formed of a transparent conductive oxide such as ITO, IZO, ITZO, zinc oxide (ZnO), and tin oxide (TO) or an alloy of ytterbium (Yb). Otherwise, the cathode 763 may be formed of a metal material.

The cathode 763 may be patterned to overlap each of the plurality of first substrates 111. That is, the cathode 763 may be formed only in an area overlapping the plurality of first substrates 111 and may not be formed in an area between the plurality of first substrates 111. The cathode 763 is formed of a transparent conductive oxide, a metal material, and the like. Thus, when the cathode 763 is formed between the plurality of first substrates 111, the cathode 763 may be damaged while the stretchable display device 700 is stretched. Thus, the cathode 763 may be formed to correspond to each of the plurality of first substrates 111 on a plane. Referring to FIG. 7, the cathode 763 may be formed in the area overlapping the plurality of first substrates 111 so as not to overlap the area where the connection lines 180 are disposed.

Unlike a general organic light-emitting display device, the cathode 763 may be patterned and formed to correspond to the plurality of first substrates 111 in the stretchable display device 700 according to still another embodiment of the present disclosure. Therefore, the respective cathodes 763 disposed on the plurality of first substrates 111 can be independently supplied with low potential power through the connection lines 180.

Referring to FIG. 7, an encapsulation layer 717 is disposed on the OLED 760. The encapsulation layer 717 covers the OLED 760 and is in contact with a portion of an upper surface of the bank 716, thereby sealing the OLED 760. Thus, the encapsulation layer 717 protects the OLED 760 from permeation of external moisture, air or physical impacts.

The encapsulation layer 717 covers the cathodes 763 patterned to overlap the plurality of first substrates 111, respectively, and may be formed for each of the plurality of first substrates 111. That is, the encapsulation layer 717 may be disposed to cover a single cathode 763 disposed on a single first substrate 111, and the encapsulation layers 717 disposed on the respective first substrates 111 may be spaced apart from each other.

The encapsulation layer 717 may be formed only in an area overlapping the plurality of first substrates 111. As described above, the encapsulation layer 717 may be configured to include an inorganic layer. Therefore, the encapsulation layer 717 may be easily damaged or cracked, when stretching the stretchable display device 700.

Particularly, since the OLED 760 is vulnerable to moisture or oxygen, if the encapsulation layer 717 is damaged, the reliability of the OLED 760 may be degraded.

embodiments of the present disclosure can also be described as follows:

According to an aspect of the present disclosure, a stretchable display device comprises a plurality of first substrates in which a plurality of pixels are defined, the plurality of first substrates being spaced apart from each other; a plurality of second substrates disposed between first substrates adjacent to each other among the plurality of first substrates to connect the adjacent first substrates; a lower substrate on which a plurality of first areas, a plurality of second areas, and a plurality of third areas excluding the plurality of first areas and the plurality of second areas are defined, the plurality of first substrates being disposed in the plurality of first areas, and the plurality of second substrates being disposed in the plurality of second areas; and a plurality of align keys disposed in a portion of the plurality of third areas and formed of an elastic material.

The plurality of align keys may be disposed to be in contact with the lower substrate.

A modulus of the plurality of align keys may be less than or equal to a modulus of the lower substrate.

The stretchable display device may further comprise an upper substrate covering the plurality of first substrate, the plurality of second substrate, the plurality of align keys, and the lower substrate, wherein the plurality of align keys may be disposed to be in contact with the lower substrate and the upper substrate.

A modulus of the plurality of align keys may be less than or equal to a modulus of the lower substrate and the upper substrate.

The plurality of align keys may include a base resin and reflective particles dispersed in the base resin.

The base resin may be formed of a same material as the lower substrate, and the reflective particles may include at least one of silver nanoparticles, silver nanowires, and silver flakes.

The stretchable display device may further comprise a plurality of third substrates having a same size as that of the plurality of first substrates; and a plurality of fourth substrates connecting third substrates adjacent to each other among the plurality of third substrates, and connecting the plurality of third substrates and the plurality of first substrates, wherein the lower substrate may include a display area in which the plurality of first substrates are disposed and a non-display area surrounding the display area, wherein the plurality of third substrates and the plurality of fourth substrates may be disposed in the non-display area.

The stretchable display device may further comprise a flexible film disposed in the non-display area, wherein the plurality of third substrates and the plurality of fourth substrates may be disposed in an area between the flexible film and one side of the display area and an area adjacent to the other side opposite to the one side of the display area, in the non-display area.

The stretchable display device may further comprise a clamp disposed to overlap the plurality of third substrates and the plurality of fourth substrates.

The lower substrate may include a display area in which the plurality of first substrates are disposed, wherein the display area may include a plurality of transfer unit areas, wherein the plurality of align keys may be disposed on both sides of each of the plurality of transfer unit areas.

The plurality of align keys may be disposed between two transfer unit areas adjacent to each other among the plurality of transfer unit areas.

According to another aspect of the present disclosure, a stretchable display device comprise an align key area in which a plurality of align keys are disposed; a plurality of line areas in which connection lines are disposed, the plurality of line areas surrounding the align key area; and a flexible substrate in which a plurality of rigid substrates are disposed, the rigid substrates being disposed between the plurality of line areas, wherein the plurality of align keys include an elastic resin and reflective particles dispersed in the elastic resin.

The plurality of align keys may be disposed to be in contact with the flexible substrate.

The elastic resin may be formed of a material having a modulus equal to or less than that of the flexible substrate, and the reflective particles may include at least one of silver nanoparticles, silver nanowires, and silver flakes.

The flexible substrate may include a display area and a non-display area surrounding the display area, and wherein the align key area may be located in the display area, and the non-display area on both sides of the display area.

The plurality of fourth substrates may be disposed in the non-display area, and the plurality of fourth substrates connect with the plurality of pixel areas disposed in the display area, the plurality of third substrates may be surrounded by the plurality of fourth substrates, the plurality of align keys may be disposed in the display area and the non-display area, and the plurality of align keys disposed in the non-display area are surrounded by the plurality of fourth substrates and the plurality of second substrates, and the plurality of fourth substrates may be disposed to be surrounded by the plurality of third substrates and the plurality of align keys.

Although embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stretchable display device, comprising:
   a plurality of first substrates in which a plurality of pixels are formed thereon respectively, the plurality of first substrates being spaced apart from each other;
   a plurality of second substrates disposed between first substrates adjacent to each other among the plurality of first substrates to connect the adjacent first substrates;
   a lower substrate having a plurality of first areas, a plurality of second areas, and a plurality of third areas excluding the plurality of first areas and the plurality of second areas, the plurality of first substrates being disposed in the plurality of first areas respectively, and the plurality of second substrates being disposed in the plurality of second areas respectively; and
   a plurality of align keys disposed in a portion of the plurality of third areas respectively and formed of an elastic material.

2. The stretchable display device of claim 1, wherein the plurality of align keys are disposed to be in contact with the lower substrate.

3. The stretchable display device of claim 2, wherein a modulus of the plurality of align keys is less than or equal to a modulus of the lower substrate.

4. The stretchable display device of claim 1, further comprising:
   an upper substrate on the plurality of first substrate, the plurality of second substrate, the plurality of align keys, and the lower substrate,
   wherein the plurality of align keys are disposed to be in contact with the lower substrate and the upper substrate.

5. The stretchable display device of claim 4, wherein a modulus of the plurality of align keys is less than or equal to a modulus of the lower substrate and the upper substrate.

6. The stretchable display device of claim 1, wherein the plurality of align keys include a base resin and reflective particles dispersed in the base resin.

7. The stretchable display device of claim 6, wherein the reflective particles are capable of being recognized by being reflected during a process of transferring a light emitting element to the plurality of first substrates.

8. The stretchable display device of claim 6, wherein the base resin is formed of a same material as the lower substrate, and
   the reflective particles include at least one of silver nanoparticles, silver nanowires, and silver flakes.

9. The stretchable display device of claim 1, further comprising:
   a plurality of third substrates having a substantially same size as that of the plurality of first substrates; and
   a plurality of fourth substrates connecting third substrates adjacent to each other among the plurality of third substrates, or connecting one of the plurality of third substrates and one of the plurality of first substrates adjacent to the one of the plurality of third substrates,
   wherein the lower substrate includes a display area in which the plurality of first substrates are disposed and a non-display area adjacent to the display area,
   wherein the plurality of third substrates and the plurality of fourth substrates are disposed in the non-display area.

10. The stretchable display device of claim 9, further comprising:
    a flexible film disposed in the non-display area,
    wherein the plurality of third substrates and the plurality of fourth substrates are disposed in an area between the flexible film and one side of the display area and an area adjacent to the other side opposite to the one side of the display area, in the non-display area.

11. The stretchable display device of claim 10, further comprising:
    a clamp overlaps the plurality of third substrates and the plurality of fourth substrates.

12. The stretchable display device of claim 9, wherein pixels are not defined on the plurality of third substrates, and an insulating layer or line is disposed on the plurality of third substrates, and connection lines disposed on the plurality of fourth substrates are electrically connected to each other through the line disposed on the third substrate.

13. The stretchable display device of claim 1, wherein the lower substrate includes a display area in which the plurality of first substrates are disposed,
    wherein the display area includes a plurality of transfer unit areas being a unit area where transfer is performed in the process of transferring a light emitting element to the display area, and
    wherein the plurality of align keys are disposed on two opposite sides of each of the plurality of transfer unit areas.

14. The stretchable display device of claim 13, wherein the plurality of align keys are disposed between two transfer unit areas adjacent to each other among the plurality of transfer unit areas.

15. The stretchable display device of claim 1, wherein the plurality of align keys have a circular shape or a substantially circular shape.

16. A stretchable display device, comprising:
    an align key area in which a plurality of align keys are disposed;

a plurality of line areas in which connection lines are disposed, the plurality of line areas surrounding the align key area; and a flexible substrate in which a plurality of rigid substrates are disposed, the rigid substrates being disposed between the plurality of line areas, wherein the plurality of align keys include an elastic resin and reflective particles dispersed in the elastic resin.

17. The stretchable display device of claim 13, wherein the plurality of align keys are disposed to be in contact with the flexible substrate.

18. The stretchable display device of claim 13, wherein the elastic resin is formed of a material having a modulus equal to or less than that of the flexible substrate, and the reflective particles include at least one of silver nanoparticles, silver nanowires, and silver flakes.

19. The stretchable display device of claim 13, wherein the flexible substrate includes a display area and a non-display area adjacent to the display area, and wherein the align key area is located in the display area, and the non-display area on two opposite sides of the display area.

20. The stretchable display device of claim 16, wherein a plurality of fourth substrates are disposed in the non-display area, and the plurality of fourth substrates connect with a plurality of pixel areas in the display area along a first direction, a plurality of third substrates are disposed between the fourth substrates adjacent to each other along the first direction of the plurality of fourth substrates, the plurality of align keys are disposed in the display area and the non-display area, and the plurality of align keys disposed in the non-display area are between the fourth substrates adjacent to each other along a second direction transverse to the first direction of the plurality of fourth substrates, and each of the plurality of fourth substrates are disposed to be surrounded by the plurality of third substrates and the plurality of align keys.

* * * * *